(12) United States Patent
Janisch et al.

(10) Patent No.: US 7,885,080 B2
(45) Date of Patent: Feb. 8, 2011

(54) SYSTEM COMPONENT OF A CONTROL DEVICE

(75) Inventors: Christian Janisch, Burglengenfeld (DE); Johannes Mehler, Regensburg (DE); Walther Seiwerth, München (DE); Peter Stetter, Reifenthal (DE); Christian Weigert, Mallersdorf-Pfaffenberg (DE); Stefan Wiesinger, Nittendorf/Schönhofen (DE)

(73) Assignee: Continental Automotive GmbH, Hannover (DE)

( * ) Notice: Subject to any disclaimer, the term of this patent is extended or adjusted under 35 U.S.C. 154(b) by 589 days.

(21) Appl. No.: 11/814,719

(22) PCT Filed: Dec. 5, 2005

(86) PCT No.: PCT/EP2005/056472

§ 371 (c)(1),
(2), (4) Date: Aug. 14, 2007

(87) PCT Pub. No.: WO2006/079432

PCT Pub. Date: Aug. 3, 2006

(65) Prior Publication Data

US 2007/0297152 A1 Dec. 27, 2007

(30) Foreign Application Priority Data

Jan. 25, 2005 (DE) .................. 10 2005 003 448

(51) Int. Cl.
*H05K 5/00* (2006.01)

(52) U.S. Cl. .................. 361/757; 361/807; 361/812

(58) Field of Classification Search .................. 361/757, 361/818, 816, 803–810, 600, 679.1, 748–752, 361/766, 790, 797, 800, 792, 795, 807, 811, 361/812; 174/250–262
See application file for complete search history.

(56) References Cited

U.S. PATENT DOCUMENTS

| 4,372,037 A | * | 2/1983 | Scapple et al. | ................ 29/613 |
| 4,682,270 A | | 7/1987 | Whiteheas et al. | |
| 6,028,770 A | * | 2/2000 | Kerner et al. | ............... 361/704 |

(Continued)

FOREIGN PATENT DOCUMENTS

DE 101 00 823 C1 2/2002

(Continued)

*Primary Examiner*—Hung S Bui
(74) *Attorney, Agent, or Firm*—Laurence A. Greenberg; Werner H. Stemer; Ralph E. Locher

(57) ABSTRACT

A system component of a control device, especially for a transmission or engine controller of a motor vehicle, is provided as a closed system component for a control device which can be transported, thereby allowing decentralized manufacturing of the system component. The system component has a hybrid circuit, equipped with electronic components, which is embedded in a printed circuit board, recessed in the center, in such a manner that the hybrid circuit is completely enclosed by the printed circuit board. The hybrid circuit and the printed circuit board are mounted on a base element and connected to each other via contact elements. A cover element is positioned on top of the hybrid circuit and the contact elements in such a manner that the hybrid circuit is fully encapsulated by the base element, the cover element and the printed circuit board from environmental influences. The inventive system component, and integrated systems comprising the same, are especially suitable for use in motor vehicles, for example transmission and engine controllers.

15 Claims, 4 Drawing Sheets

U.S. PATENT DOCUMENTS

| | | | |
|---|---|---|---|
| 6,879,039 B2 * | 4/2005 | Khan et al. | 257/730 |
| 7,193,852 B2 * | 3/2007 | Wetzel | 361/714 |
| 7,375,966 B2 * | 5/2008 | Murakami et al. | 361/707 |
| 2003/0202333 A1 | 10/2003 | Loibl | |

FOREIGN PATENT DOCUMENTS

| | | |
|---|---|---|
| DE | 101 10 620 A1 | 9/2002 |
| DE | 299 24 634 U1 | 7/2004 |
| JP | 2000124578 | 4/2000 |
| JP | 2003198029 | 7/2003 |

\* cited by examiner

2

SYSTEM COMPONENT OF A CONTROL DEVICE

BACKGROUND OF THE INVENTION

Field of the Invention

The invention relates to a system component of a control device, in particular for transmission or engine controllers of a motor vehicle, at least comprising a hybrid circuit fitted with electronic components.

Handling systems for manufacturing hybrid circuits on a ceramic substrate base differ in many ways from the systems for manufacturing printed circuit boards.

Printed circuit boards are frequently up to 600×600 mm in size, have a certain degree of elasticity and are made from a material that is more soft than hard. Ceramic substrates (thick-film or low temperature co-fired ceramics (LTCCs)) are to date generally even smaller than 200×200 mm, are brittle, liable to fracture and have a high level of abrasiveness. This major difference must be taken into account when developing and building handling systems for hybrid manufacture.

The production process for manufacturing ceramic hybrids includes the following technologies: screen printing with drying and burning in of the printed pastes, thick and thin wire bonding, laser trimming of circuits and SMD mounting. Once the substrate sheet has been manufactured, the circuits are separated by fracturing the substrates and mounting individual circuits in housings or on heat sinks. Different process systems from different manufacturers are available for these production stages up to manufacture of the substrate sheet.

The few manufacturers specializing in control devices with hybrid circuits have concentrated to date on the automatic loading and unloading of their process systems and the linking of these machines to a fully automated production line.

The fitted ceramic substrates are hereby adhered for example to an aluminum support and brought into contact with the printed circuit board (in a rigid or flexible manner, with the function here of conductor routing to other components) and/or the other module components (sensors, plugs, etc.) by wire bonding. The housing space is then filled with gel to protect the LTCC and the bond surfaces on the LTCC and the components. Depending on the application the other components are inside or outside the gel-filled LTCC housing. The components outside are brought into contact by means of perforated grids or flexible printed conductors, which are guided outward in a sealed manner through the hermetically sealed space.

Within the context of globalization it is however increasingly disadvantageous to manufacture such control devices totally at one site. Individual components such as housings, plugs, sensors, etc. of the control system can often be procured and/or mounted locally on more favorable terms.

The financial outlay for appropriate transportation of a fitted LTCC has however hitherto been greater than total manufacture at one site. Not only do the sensitive wire bond pads have to be protected from contact but also the fitted ceramic substrates cannot be exposed to ambient air over a longish period due to the risk of oxidation. Transportation by sea would have additional risk potential due to the salt water. When transported by air the low temperatures and the condensation forming as a result put the quality of the parts at risk. Finally it should also preferably be possible to handle the fitted ceramic substrates in an automated manner as before up to the casting process, to ensure corresponding quality. All of this means that an additional automated packing and unpacking system for transportation at the respective sites is just as necessary as additional systems for removing from and feeding into the manufacturing system.

On the other hand total displacement of manufacture "to the customer" is similarly unacceptable, as additional production lines would not be fully utilized.

SUMMARY OF THE INVENTION

Based on the above, the object of the present invention is to provide a system component of a control device comprising a hybrid circuit, which can be transported without complex packing and unpacking measures.

According to the invention this object is achieved by a system component of a control device with the features of claim 1 and by a control device with the features of claim 12. Advantageous embodiments and developments, which can be employed individually or in combination, are the subject matter of the dependent claims.

According to the invention the system component of a control device comprises a hybrid circuit fitted with electronic components, said hybrid circuit being embedded in a printed circuit board recessed in the center in such a manner that the hybrid circuit is completely enclosed by the printed circuit board. The hybrid circuit and printed circuit board are thereby mounted on a base element and brought into contact with each other by way of contact elements. Finally a cover element is disposed above the hybrid circuit and the contact elements in such a manner that the hybrid circuit is fully encapsulated by the base element, cover element and printed circuit board against environmental influences.

A seal is for example configured on the cover element for this purpose. Alternatively or additionally the hollow space below the cover element is filled with a medium such as a gel, an adhesive, etc.

According to the invention the printed circuit board at least is preferably adhered and/or laminated to the base element in a sealed manner.

The base element contains aluminum to dissipate heat to prevent thermally induced stresses.

In contrast cover elements made of a low-cost plastic have proven effective.

To facilitate automated manufacturing processes, bond wires are expediently provided as the contact elements.

In a particularly preferred development of the invention contact points are configured on the printed circuit board outside the cover element, in particular allowing contact by way of wire bonding, press-fit technology, card-edge connectors, solder, screws and/or rivets. While the bond surfaces of the other module components (plugs, sensors, etc.) which were to be brought into direct contact with a hybrid circuit by means of wire bonding, hitherto had to have a special coating, for example nickel-gold alloys, the contacts of the module components for press-fit contacts according to the invention for example require a significantly more economical surface coating, e.g. made of nickel-tin alloys.

Finally the present invention allows a close arrangement of "large" components such as capacitors, coils, quartzes, etc., on the printed circuit board, such components typically not being able to be mounted on the hybrid circuit in particular due to their mass, height, etc.

Finally the present invention also relates to a control device with at least one system component described above, with a control device cover encapsulating the control device, facing the base element or a separate control device base, against environmental influences, whilst maintaining the possibility of contact between the control device and peripheral sensors and/or modules of the motor vehicle. If a number of inventive system components are mounted in the control device, these can be encapsulated against environmental influences as described in a common manner and/or individually (in each instance).

The inventive system component is suitable—as are overall systems containing such—in particular for applications in motor vehicles, for example for transmission or engine controllers.

Further details and advantages of the invention are described in relation to an exemplary embodiment with reference to the accompanying schematic figures, in which:

DESCRIPTION OF THE INVENTION

Figure 1:
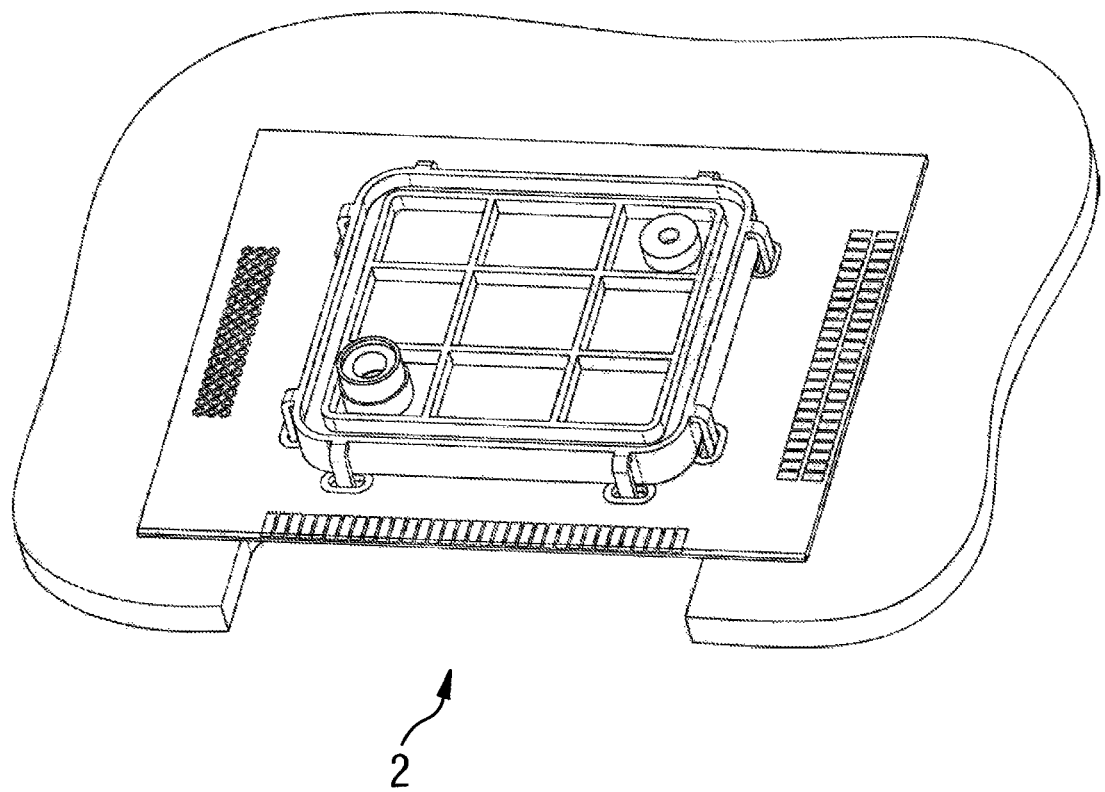
FIG. 1 shows a perspective top view of a system component according to the invention.

In the description which follows of a preferred embodiment of the present invention the same reference characters are used to refer to identical or comparable components.

Figure 2:
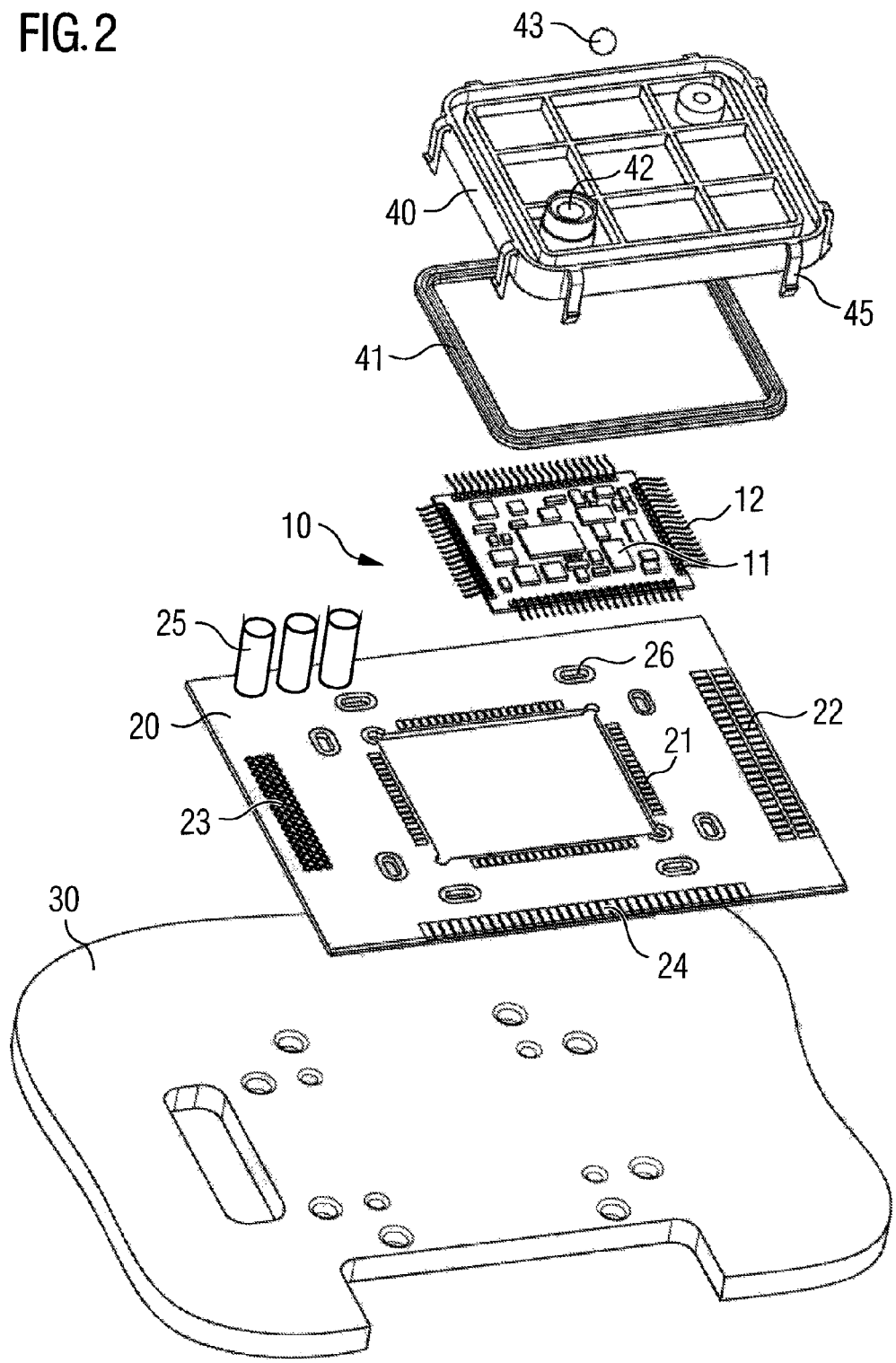
FIG. 2 shows the system component according to FIG. 1 in an exploded diagram.

FIG. 1 shows a perspective top view of a system component 2 according to the invention, while FIG. 2 shows the system component 2 according to FIG. 1 in an exploded diagram. It can clearly be seen how the system component 2 is embodied in such a manner that all the stages of work on a hybrid circuit 10 fitted with electronic components 11, in particular an LTCC 10, are completed in such a manner that it 10 can be encapsulated.

To this end a printed circuit board 20 (e.g. PCB such as FR4) is recessed in the center in such a manner that the fitted LTCC 10 can be embedded in the PCB 20 in such a manner that it is completely enclosed by the PCB 20.

The LTCC 10 and PCB 20 are then positioned on a control device housing base 30, which preferably contains aluminum, and are brought into contact 21 with each other by means of wire bond wires 12.

At least the PCB 20 is mounted (e.g. adhered and/or laminated, etc.) on the control device housing base 30 in a sealed manner and serves as counterpart for the wire bonding of the LTCC 10. The PCB 20 is also used to guide the contact paths out of the subsequently encapsulated, in other words closed, system and to allow them to be terminated in a suitable manner for continuing conduction.

Latching means 45 are preferably configured on the LTCC cover 40 and interact with the latching grooves 26 configured in the BCP 20. Converse arrangements of the latching elements 26 and 45 are also conceivable.

The cover 40 is sealed off from the PCB 20 by way of a seal 41 for example. Alternatively or additionally a gland 42 is configured in the cover 40, by way of which the hollow space below the cover 40 can be filled with a gel, adhesive (not shown), etc. to protect against environmental influences. The gland 42 is preferably configured to hold a sealing ball 43 tightly, sealing the hollow space in a permanent manner. Alternatively or additionally a medium can be used, which hardens after filling.

The control device housing base 30, the PCB 20 and the LTCC cover 40 form a hermetically sealed system 2 for the LTCC 10, 11 and the bond contacts 12. This results in a closed system component (2) for a control device (1), which can advantageously be transported for the first time without complex packing measures, etc.

Depending on requirements and the situation this transportable submodule 2 can also be premounted with further components (plugs, sensors, etc.) or can be transported for final mounting. At the final mounting site the components still to be mounted are added to the submodule 2 to form a control device 1.

Figure 3:
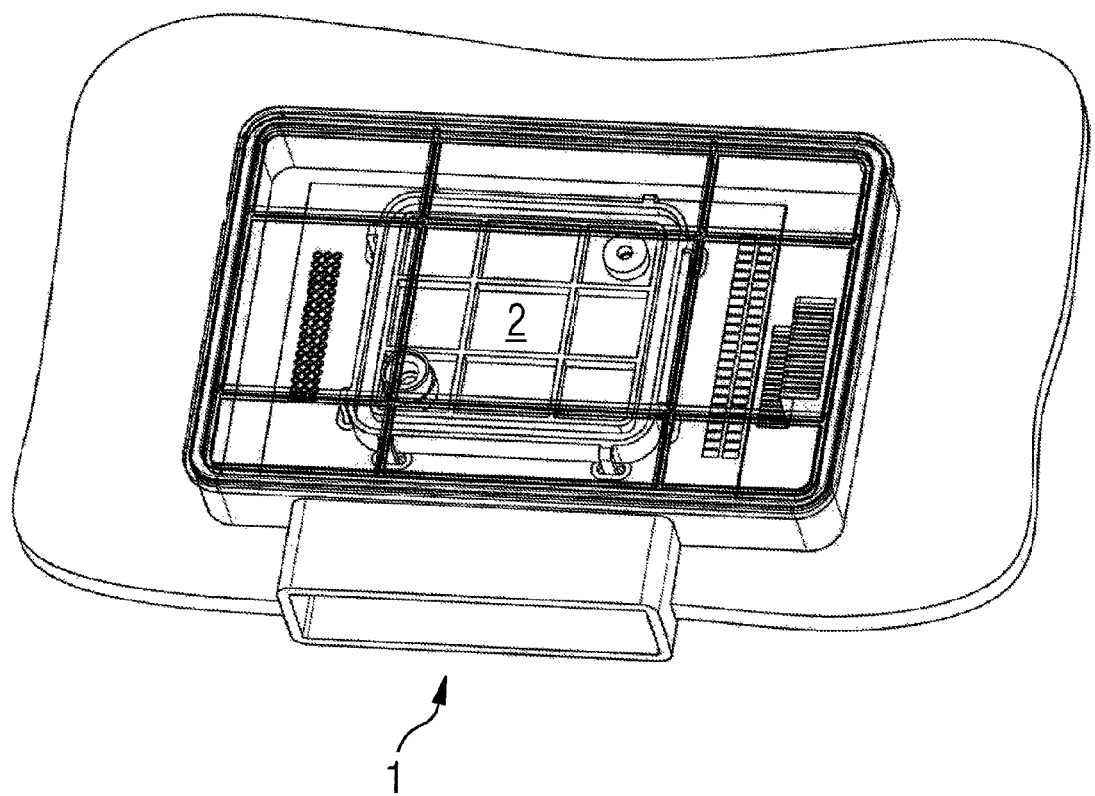
FIG. 3 shows a perspective top view of a control device according to the invention.
Figure 4:
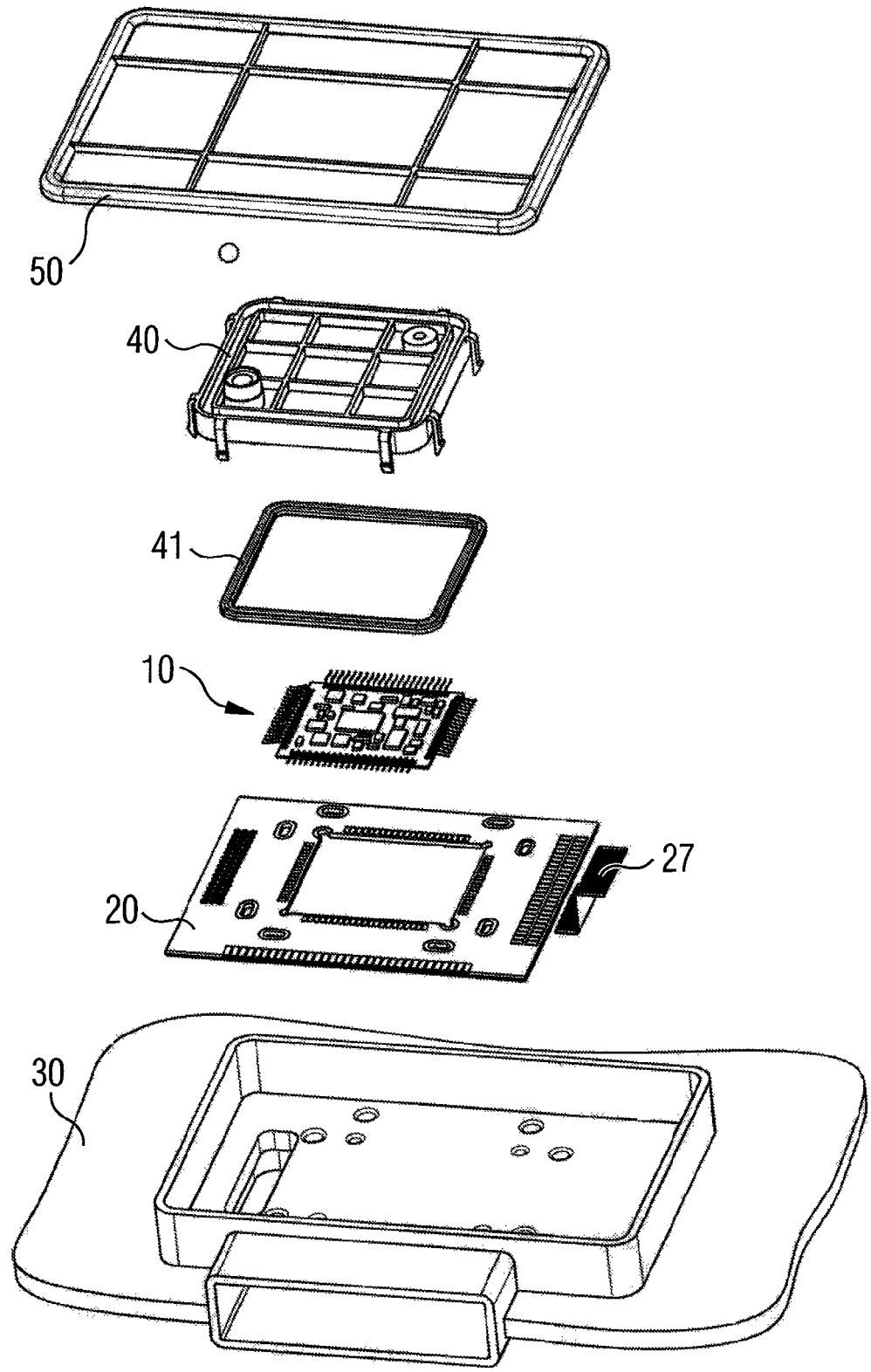
FIG. 4 shows the control device according to FIG. 3 in an exploded diagram.

FIG. 3 shows a perspective top view and FIG. 4 an exploded diagram of such a control device 1, in particular for transmission or engine controllers of a motor vehicle, at least comprising a system component 2, as described above.

It can clearly be seen how a further control device cover 50 encapsulates the separately encapsulated system component 2 as well as further components 25, facing the base element 30 or a separate control device base (not shown), against environmental influences, whilst maintaining the possibility of contact 23, 24, 25 between the control device 1 and peripheral sensors and/or modules (not shown) of the motor vehicle.

There are no restrictions with regard to the design of the overall system 1 or for the system component 2. It can be constructed and embodied in a similarly hermetically sealed manner (or not).

With the inventive system component 2 it is possible for the first time to centralize hybrid manufacture at one site, whilst still benefiting from the advantages, such as low wage and parts costs, lower import duties, etc. of other sites.

In the course of displacement or division there is no need for any new or complete qualification of the overall device 1, as the components remain the same but are simply manufactured or finally mounted at different sites.

Nor is any further or new technology required to produce the premounted product 2. In particular it is possible to use already introduced manufacturing processes to prepare the fitted LTCC 10 for transportation.

The fitted LTCC 10 is correctly processed and protected from the point of view of process and quality matters.

The necessary application of the LTCC 10 for example to an aluminum support 30 (keywords: thermal expansion and heat dissipation) is similarly feasible, as this support 30, being the control device housing base 30, is part of the end product 1 at the same time.

The components required in addition (the LTCC cover 40 with seal 41 and the PCB 20) are less expensive parts financially speaking.

Multilayer printed circuit boards 20 can also advantageously be used, to route the LTCC 10 further or to guide contacts points 22, 23, 24 outside the closed module 2 to more suitable required positions.

Further contact 22, 23, 24 can be continued on the printed circuit board 20 using simple and different methods, for example with wire bonding 22, press-fit technology 23, card-edge connectors 24, solder, screws, rivets, etc (latter not shown).

If a further flexible printed conductor 27 (so-called flex film) is to be used, this can be done with individual strips, resulting in an increased advantage, as cost-intensive flex films enclosing the LTCC 10, as in the prior art, are no longer necessary.

Because a rigid printed circuit board 20 is already used as a system element in the sealing system 2 for the transportable ceramic substrate 10, the additional contact possibilities (press-fit 23 or card-edge 24 contacts) can be used for current-carrying module components such as plugs, sensors, etc., at no additional cost, thereby reducing overall costs further.

Also larger components 25, such as capacitors, coils, quartzes, etc., which cannot generally be mounted on a ceramic substrate circuit support 10 because of their mass, height, etc., can be attached to the already present rigid printed circuit board 20 and brought into contact using the connection methods mentioned above.

Finally the nickel-tin surface coated contacts of the module components for press-fit contacts 23 for example are significantly more economical than specially coated bond surfaces made of nickel-gold for example. Also the semi-finished products (sheet, coils) for the pins are already available on the market with this coating.

The inventive system component 2 therefore first of all allows decentralized manufacturing processes and is suitable—as are overall systems 1 containing such—in particular for applications in motor vehicles, for example for transmission or engine controllers.

The invention claimed is:

1. A system component of a control device, comprising:
   a base element;
   a printed circuit board formed with a void in a center thereof;
   a hybrid circuit including electronic components, said hybrid circuit located in said void, said hybrid circuit embedded in said printed circuit board and completely surrounded by said printed circuit board;
   contact elements forming contacts between said hybrid circuit and said printed circuit board;
   said hybrid circuit and said printed circuit board being disposed on said base element; and
   a cover element disposed above said hybrid circuit and said contact elements, said cover element together with said base element and said printed circuit board fully encapsulating said hybrid circuit;
   wherein said printed circuit board is not fully encapsulated by said cover element and said base element.

2. The system component according to claim 1, configured as a component of a transmission controller or an engine controller of a motor vehicle.

3. The system component according to claim 1, which comprises a seal disposed on said cover element.

4. The system component according to claim 1, wherein said cover element defines a hollow space therebelow, and said hollow space is filled with a medium.

5. The system component according to claim 1, wherein said printed circuit board is sealingly adhered and/or laminated to said base element.

6. The system component according to claim 1, wherein said base element contains aluminum.

7. The system component according to claim 1, wherein said cover element is made of plastic.

8. The system component according to claim 1, wherein said contact elements are bond wires.

9. The system component according to claim 1, which comprises contact points formed on said printed circuit board outside said cover element.

10. The system component according to claim 9, wherein said contact points are formed to allow contacting by at least one contact means selected from the group consisting of wire bonding, press-fit technology, card-edge connectors, solder, screws, and rivets.

11. The system component according to claim 1, wherein said printed circuit board is formed to carry components that cannot typically be mounted in said hybrid circuit.

12. A control device, comprising a system component according to claim 1, a control device cover for encapsulating the control device while maintaining a possibility of contact between the control device and peripheral sensors and/or auxiliary modules, said control device cover facing said base element or a control device base.

13. The control device according to claim 12 configured as a transmission controller or an engine controller of a motor vehicle.

14. The system component according to claim 1, further comprising additional components mounted on said printed circuit board, said additional components not being encapsulated by said cover element.

15. The system component according to claim 14, further comprising an additional cover cooperating with said base element to encapsulate said additional components mounted on said first printed circuit board and to encapsulate said hybrid circuit.

* * * * *